United States Patent
Nakajima

(10) Patent No.: US 7,359,201 B2
(45) Date of Patent: Apr. 15, 2008

(54) HEAT-GENERATING ELECTRONIC PART COVER AND COVER MOUNTING METHOD

(75) Inventor: Takeshi Nakajima, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/538,984

(22) Filed: Oct. 5, 2006

(65) Prior Publication Data

US 2007/0086165 A1    Apr. 19, 2007

(30) Foreign Application Priority Data

Oct. 19, 2005  (JP) ............... 2005-304324

(51) Int. Cl.
   *H05K 7/20* (2006.01)
   *H01L 23/34* (2006.01)

(52) U.S. Cl. ............ 361/704; 361/713; 361/718; 165/104.33; 257/717; 257/796

(58) Field of Classification Search ............ 361/704, 361/713, 717–718; 165/104.33, 185; 257/717, 257/796
   See application file for complete search history.

(56) References Cited

U.S. PATENT DOCUMENTS

| | | | |
|---|---|---|---|
| D265,987 S | * | 8/1982 | McCarthy ............ D13/179 |
| 4,827,329 A | * | 5/1989 | Schach et al. ............ 257/796 |
| 5,592,021 A | * | 1/1997 | Meschter et al. ............ 257/727 |
| 5,773,881 A | * | 6/1998 | Kato ............ 257/685 |
| 6,306,957 B1 | * | 10/2001 | Nakano et al. ............ 524/700 |
| 6,587,344 B1 | * | 7/2003 | Ross ............ 361/704 |

FOREIGN PATENT DOCUMENTS

| | | |
|---|---|---|
| JP | 57-2666 | 1/1982 |
| JP | 3-53510 | 11/1991 |

* cited by examiner

*Primary Examiner*—Michael Datskovski
*Assistant Examiner*—Robert J Hoffberg
(74) *Attorney, Agent, or Firm*—Oblon, Spivak, McClelland, Maier & Neustadt, P.C.

(57) ABSTRACT

A cover is mounted to a heat-generating electronic part (T) for electrical insulation and heat dissipation purposes. The cover comprises a hollow cover body (20) of rectangular prism shape having a top wall (23), bottom wall (24), side walls, open front wall (21) and closed rear wall (22) and defining a hollow interior (27) into which the electronic part (T) is to be inserted. The interior has sufficient dimensions to accommodate the electronic part. The top and bottom walls are formed flat for slidable contact with the electronic part. The bottom wall is at least 0.1 mm thicker than the top wall.

8 Claims, 3 Drawing Sheets

PRIOR ART

US 7,359,201 B2

HEAT-GENERATING ELECTRONIC PART COVER AND COVER MOUNTING METHOD

CROSS-REFERENCE TO RELATED APPLICATION

This non-provisional application claims priority under 35 U.S.C. §119(a) on Patent Application No. 2005-304324 filed in Japan on Oct. 19, 2005, the entire contents of which are hereby incorporated by reference.

TECHNICAL FIELD

This invention relates to a heat conductive, electrically insulating cover, also known as heat-dissipating sheet cap, for heat-generating electronic parts. Specifically, it relates to a heat conductive, electrically insulating cover for heat-generating electronic parts such as power transistors, having advantages including easy attachment, little increase in the overall volume of the electronic part as a result of cover attachment, and a reduction in creepage distance for the electrical insulation between the heat-generating electronic part and another electronic part. More particularly, it relates to a heat-generating electronic part cover in which a single heat-dissipating sheet cap is applicable to both an application where heat dissipation is a matter of concern and a power supply or similar application where electrical insulation is a matter of concern. It also relates to a method of mounting a cover to a heat-generating electronic part.

BACKGROUND ART

With the recent progress of miniaturization of electronic and electric equipment to higher density, the problem of heat dissipation of heat-generating electronic parts such as power transistors built in such equipment becomes highlighted.

Among heat-generating electronic parts used in the art, for example, the power transistor has a structure as shown in FIG. 1. A power transistor T includes a power transistor body 3 of rectangular shape having a bottom surface 3*a* and a top surface 3*b* which are flat, a plurality of (three in FIG. 1) terminals 5 projecting from one end of the body 3, and a plate-shaped heat spreader 4 attached to the transistor body 3. Specifically, a lower corner portion of the transistor body 3 opposed to the terminal-projecting end is machined in a quadrangular shape to define a notch 3*c*. One end of the plate-shaped heat spreader 4 is fitted in the notch 3*c* while the other end of the heat spreader 4 extends in a direction opposite to the terminal projecting direction. The plate-shaped heat spreader 4 having a flat bottom surface is attached to the transistor body 3 such that the bottom surface of the heat spreader 4 is flush with the bottom surface 3*a* of the transistor body 3. Any one of the three terminals 5 extends through the power transistor body 3 and is connected to the plate-shaped heat spreader 4. Typically, the power transistor T of the above-described structure is fixedly secured to an external heat sink (not shown) such as a metal chassis while an electrically insulating, heat transfer sheet of synthetic resin or rubber is interposed between the external heat sink and the heat spreader 4. The heat produced by the power transistor T during operation is conducted from the heat spreader 4 to the external heat sink. Heat dissipation occurs in this way.

When sheets of synthetic resin or rubber were interposed, there arose problems including inefficient operation due to frequent misalignment and too large a creepage distance for electrical insulation. It was thus proposed in JP-U-A S57-2666 to use a tube of synthetic resin or rubber. FIG. 2 illustrates a tubular cover as disclosed therein. The tubular cover in FIG. 2 is cylindrical and open at both upper and lower ends 1 and 2.

When the power transistor is enclosed using the tubular cover, the power transistor with its plate-shaped heat spreader 4 facing forward is inserted into the tubular cover through the lower open end 2 until only the three terminals project out of the lower open end 2 of the cover. Typically, the cover having the power transistor accommodated therein is fixedly secured to an external heat sink. In the event that the power transistor is enclosed within a prior art tubular cover, surplus spaces are left around the power transistor because the cross-sectional shape of the tube does not conform to the cross-sectional shape of the transistor. The presence of such surplus spaces is against the trend toward miniaturization of electronic equipment.

Where the power transistor is accommodated within the tubular cover, the rear end of the tubular cover opposite to the terminal-projecting one end is left open. Now that electronic parts are assembled at a high density, an electric discharge can occur between the heat spreader and an external heat sink or another electronic part through this rear opening, causing a malfunction.

Then, as shown in FIG. 3, an open rear portion of the tubular cover 6 is folded along an inside line over the remaining portion, closing the rear end of the cover. The end-folded cover 6 is interposed between two external heat sinks 7 and 8, which are secured together by a screw 9. This overcomes the problem associated with a tubular cover having open ends.

When the tubular cover is set in place within an electronic equipment in this way, however, the folded portion is often stretched out and the folded portion provides a thickness buildup to prevent smooth attachment, adversely affecting operation efficiency. Undesirably the cover tends to start degradation from the folded portion.

One solution to these problems is shown in FIG. 4. JP-U-B H03-53510 discloses a cover for a heat-generating electronic part, comprising a heat conductive, electrically insulating sleeve 12 which is open at one end 10 and closed at another end 11. The width and height of the opening substantially correspond to the width and height of an electronic part to be inserted therein. The sleeve 12 has flat inside surfaces that define an internal space and correspond to the flat surfaces of the electronic part. The cover 12 of this utility model has advantages including easy attachment, little increase in the overall volume of the power transistor as a result of cover attachment, and a reduction in creepage distance to another electronic part or external heat sink, but suffer from problems as discussed below. The cover includes a top wall 12*a* and a bottom wall 12*b* of substantially the same thickness having flat inside surfaces corresponding to the flat surfaces of the electronic part. The cover 12 having the electronic part T enclosed therein is secured to external heat sinks such as heat-dissipating metal fins. If the cover top and bottom walls 12*a* and 12*b* in contact with the external heat sinks are too thick, the cover exerts poor heat-dissipating effect. Inversely, if the cover top and bottom walls 12*a* and 12*b* are too thin, the cover may allow for short-circuiting with the heat-dissipating metal fins or exerts poor electrically insulating effect. The same cover with top and bottom walls of equal thickness is not applicable to both an application where heat dissipation is a matter of concern and a power supply or similar application where electrical insulation is a matter of concern. Plural types of covers which differ in the thickness of top and bottom walls (for example, one type of cover having thick top and bottom walls and another type of cover having thin top and bottom walls) must be furnished in advance for the respective applications. This causes such inconvenience as a need for capital investment for a plurality of molds.

DISCLOSURE OF THE INVENTION

A first object of the invention is to provide a cover for a heat-generating electronic part such as a power transistor, having advantages including easy attachment and a minimized increase in the overall volume of the electronic part as a result of cover attachment.

A second object of the invention is to provide a cover for a heat-generating electronic part, which can reduce the creepage distance to another electronic part or external heat sink.

A third object of the invention is to provide a cover for a heat-generating electronic part in which a single cover, i.e., single heat-dissipating sheet cap is applicable to both an application where heat dissipation is a matter of concern and a power supply or similar application where electrical insulation is a matter of concern.

A fourth object of the invention is to provide a method of mounting the cover to a heat-generating electronic part.

In one aspect, the invention provides a cover for the electrical insulation and heat dissipation of a heat-generating electronic part having a top surface and a bottom surface at least one of which is flat. The cover comprises a hollow cover body of quadrangular prism shape having a top wall, a bottom wall, side walls, one open end and another closed end and defining a hollow interior into which the electronic part is to be inserted. The interior has a width and a height that substantially correspond to a maximum width and a maximum height of the electronic part, respectively. The top and bottom walls of the cover body have inside surfaces which are formed flat so as to correspond to the flat surface of the electronic part and slidably contact therewith. The top and bottom walls of the cover body are formed to different thickness so that one wall is at least 0.1 mm thicker than the other wall.

Of the top and bottom walls of the cover body, preferably the one wall is 0.1 mm to 0.9 mm thicker than the other wall. Also preferably, the one wall has a thickness of 0.4 mm to 1.0 mm and the other wall has a thickness of 0.15 mm to 0.5 mm. Typically, the hollow interior of the cover body is rectangular in cross section. Also preferably, the outside surface of the other closed end of the cover body bears marking that indicates at least one of the thicknesses of the top and bottom walls.

In a preferred embodiment, the cover body is formed of a cured silicone rubber composition loaded with an heat conductive, electrically insulating inorganic filler. More preferably, the cured silicone rubber composition has a heat conductivity of at least 0.5 W/m·° C.

Typically, the electronic part to be inserted into the cover is rectangular in cross section.

In another aspect, the invention provides a method of mounting the cover defined above to a heat-generating electronic part, the heat-generating electronic part having a flat surface and including a plate-shaped heat spreader having a flat surface extending from the flat surface of the electronic part. The method involves the steps of (a) selecting a mounting strategy from a first strategy (1) that the flat surface of the heat spreader is in abutment with the inside surface of the thicker one of the top and bottom walls of the cover body whereby the heat spreader is in contact with an external heat sink via the thicker wall, and a second strategy (2) that the flat surface of the heat spreader is in abutment with the inside surface of the thinner one of the top and bottom walls of the cover body whereby the heat spreader is in contact with an external heat sink via the thinner wall, and (b) inserting the electronic part into the hollow interior of the cover body in accordance with the selected strategy so that the cover accommodates the electronic part.

BENEFITS OF THE INVENTION

The cover for heat-generating electronic part of the invention defines an interior which geometrically conforms to the heat-generating electronic part (e.g., power transistor) to be inserted therein, leaving no surplus space after attachment. Since the rear end of the cover receiving the rear end of the heat-generating electronic part (e.g., the heat spreader side of the power transistor) which is open to the outside in the case of prior art covers is closed by the solid wall, no electric discharge can occur from the heat spreader of the power transistor to another electronic part. Accordingly, in an electronic equipment, the distance between the heat-generating electronic part (e.g., power transistor) and another electronic part can be reduced. By virtue of such distance reduction, even when another electronic part is placed close to the heat-generating electronic part (e.g., powder transistor), the invention avoids any malfunction due to electric discharge from the heat spreader of the power transistor.

The cover of the invention can be easily mounted to the heat-generating electronic part (e.g., power transistor). When the cover is formed of inorganic filler-loaded silicone rubber, further improvements in both heat dissipation and electrical insulation are achieved.

Since the cover of the invention has top and bottom walls of different thickness (i.e., two types of wall) having flat inside surfaces corresponding to the flat surface of the electronic part, a single cover is applicable to both an application where heat dissipation is a matter of concern and a power supply or similar application where electrical insulation is a matter of concern, by selecting a mounting strategy from the first strategy that the heat spreader of the heat-generating electronic part (e.g., power transistor) is in contact with an external heat sink via the thicker wall so that the cover provides better electrically insulating effect, and the second strategy that the heat spreader of the heat-generating electronic part (e.g., power transistor) is in contact with an external heat sink via the thinner wall so that the cover provides better heat dissipating effect.

DESCRIPTION OF THE PREFERRED EMBODIMENTS

In the specification and the claims which follow, reference will be made to a number of terms which shall be defined to have the following meanings:

The terms "top" and "bottom" are used to indicate relative positions as viewed in the figure, but merely for convenience of description to distinguish one component from the opposed component. Similarly, the terms "front" and "rear," and "upper" and "lower" refer to relative positions, but are merely used for convenience of description.

Figure 1:
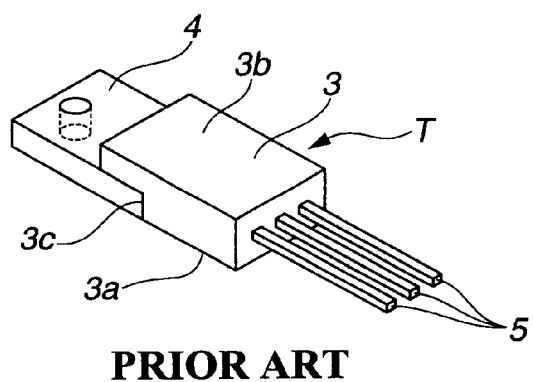
FIG. 1 is a perspective view of a power transistor as a typical heat-generating electronic part.
Figure 2:
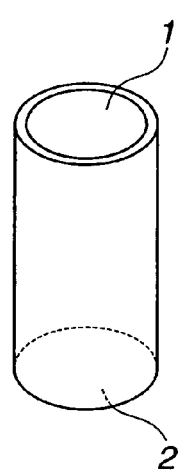
FIG. 2 is a perspective view of a prior art tubular cover.
Figure 3:
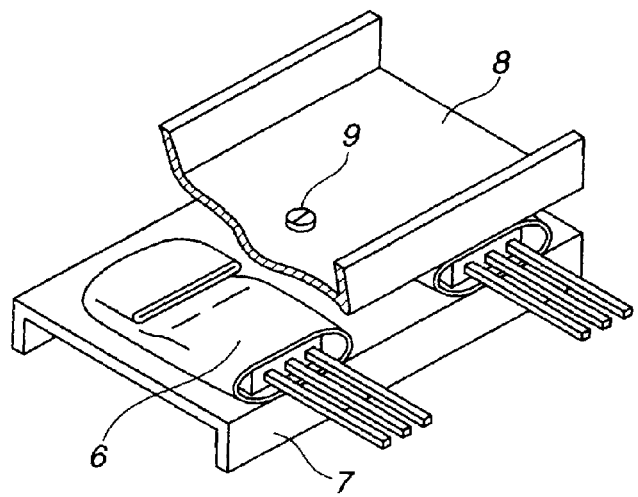
FIG. 3 is a partially cut-away, perspective view of power transistors enclosed within prior art tubular covers.
Figure 4:
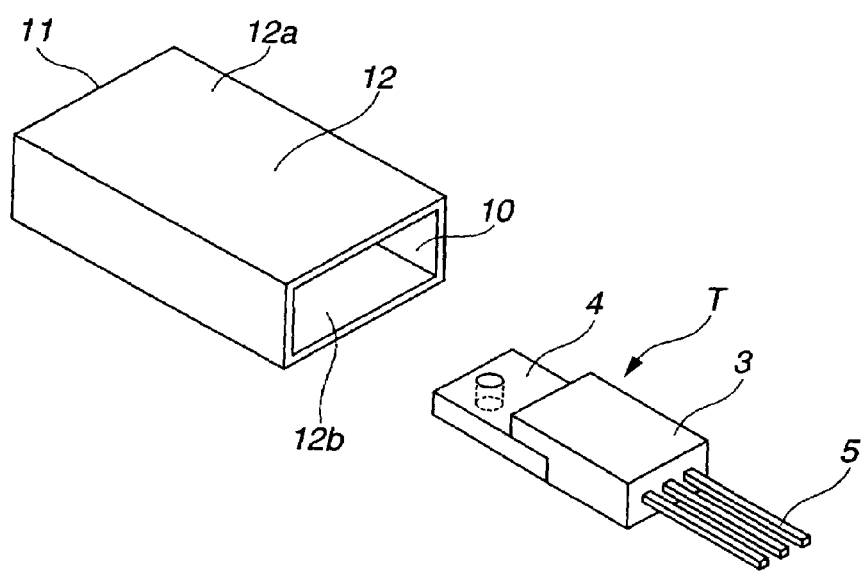
FIG. 4 is a perspective view of a prior art hollow cover and a heat-generating electronic part.
Figure 5:
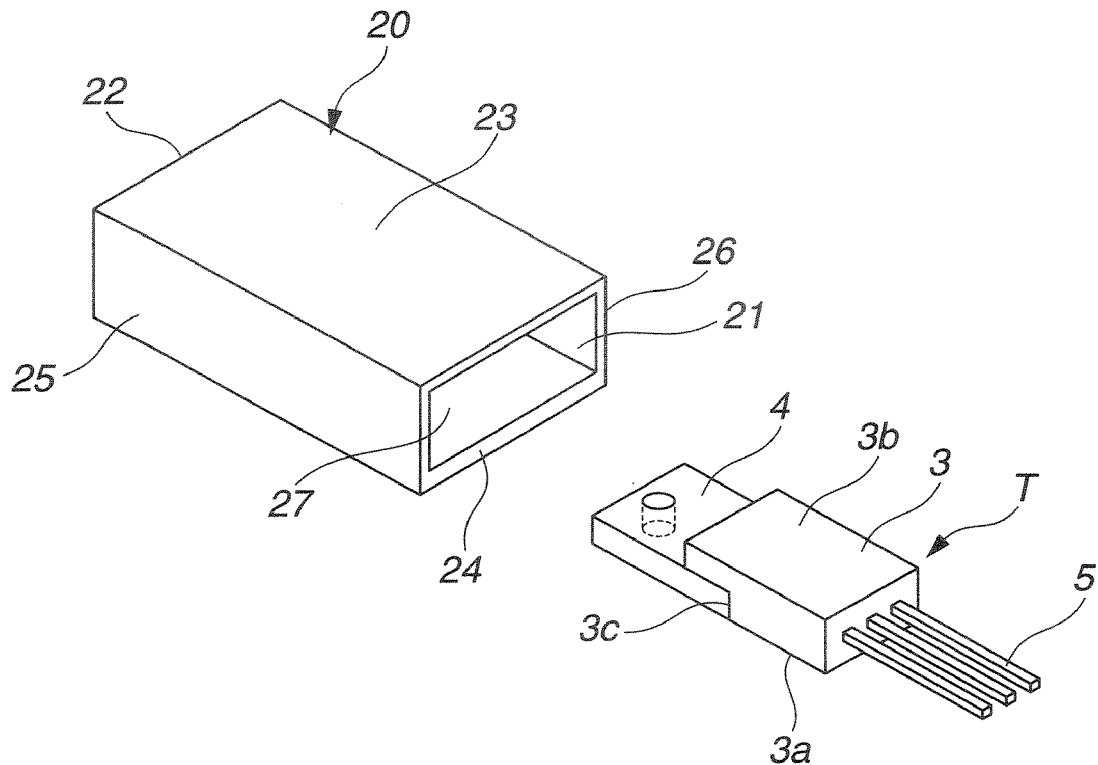
FIG. 5 is a perspective view of a cover in one embodiment of the invention and a heat-generating electronic part.

Referring to FIG. 5, there is illustrated a cover according to one embodiment of the invention. The cover is used for enclosing a heat-generating electronic part, typically a power transistor as shown in FIG. 1 for mounting and attaching purposes. Briefly stated, the power transistor T includes a power transistor body 3 of rectangular shape having a top surface 3b and a bottom surface 3a which are flat in the illustrated embodiment, three projecting terminals 5, and a plate-shaped heat spreader 4 attached to the transistor body 3 such that the bottom surface of the heat spreader 4 is flush with the bottom surface 3a of the transistor body 3.

The cover comprises a hollow cover body 20 of quadrangular prism (or rectangular tubular) shape having one open end 21 for allowing the power transistor T to be inserted therethrough and another closed end 22. The cover body 20 which is open at the front end 21 and closed at the rear end 22 has a top wall 23, a bottom wall 24 and side walls 25 and 26 which are solid, i.e., free of openings. These walls define a hollow interior 27 into which the power transistor T is to be inserted. Since the cover has no openings except the front opening 21, no electric discharge can occur between the plate-shaped heat spreader 4 of the power transistor T and another electronic part or external heat sink. The invention inhibits any malfunction due to the presence of an opening.

When the power transistor T is inserted into the cover 20 in the direction shown in FIG. 5, the inside surface of the bottom wall 24 of the cover is in contact with the bottom surface of the heat spreader 4, and the inside surface of the top wall 23 is not in contact with the bottom surface of the heat spreader 4. The inside surfaces of the top and bottom walls 23 and 24 are formed as flat surfaces which conform to the flat bottom surface of the heat spreader 4. The hollow interior 27 of the cover body has a width and a height that substantially correspond to a maximum width and a maximum height of the power transistor T, respectively. Since the inside surfaces of the top and bottom walls 23 and 24 are formed as flat surfaces, these inside surfaces serve as guides allowing for sliding motion of the bottom surface of the heat spreader 4 of the power transistor T when the power transistor is inserted into the cover. This ensures efficient attachment operation.

When the cover 20 is mounted to the power transistor T, the mounting strategy is selected for a particular application. In the embodiment wherein the power transistor (heat-generating electronic part) is used in the application where heat dissipation is a matter of concern, the power transistor T is inserted into the hollow interior 27 of the cover body 20 such that the bottom surface of the heat spreader 4 of the power transistor T is in abutment with the inside surface of the thinner one of the walls 23 and 24 (the thinner wall is the top wall 23 in the illustrated embodiment of FIG. 5, suggesting that the cover is turned up-side-down from the illustrated posture). The outside surface of the thinner wall (the top wall 23) is contacted and secured to an external heat sink (not shown).

In the other embodiment wherein the power transistor (heat-generating electronic part) is used in the power supply or similar application where electrical insulation is a matter of concern, the power transistor T is inserted into the hollow interior 27 of the cover body 20 such that the bottom surface of the heat spreader 4 of the power transistor T is in abutment with the inside surface of the thicker one of the walls 23 and 24 (the thicker wall is the bottom wall 24 in the illustrated embodiment of FIG. 5, suggesting that the cover is kept in the illustrated posture). The outside surface of the thicker wall (the bottom wall 24) is contacted and secured to an external heat sink (not shown). Using the mounting strategies described above, the cover performs in two ways such that it exerts a better heat dissipating effect to the external heat sink in the application where heat dissipation is a matter of concern, whereas it exerts a better electrically insulating effect preventing any short-circuit with the external heat sink such as heat release metal fins in the application where electrical insulation is a matter of concern.

The cover of the invention generally has a hollow tubular shape defining an interior that conforms to the cross-sectional shape of the power transistor. Specifically, for the power transistor T comprising a transistor body 3 of a quadrangular shape such as rectangular or square shape, the cover is preferably shaped as a hollow quadrangular prism (or tubular rectangular prism) wherein the hollow interior of the cover extending from the front opening to the closed rear wall is of a quadrangular shape such as rectangular or square shape, which substantially corresponds to the transverse cross-sectional shape of the power transistor body 3 and the hollow interior can accommodate the body and heat spreader of the power transistor. Since the cover is shaped so that its interior conforms to the shape of the power transistor to be inserted therein, the attachment of the cover is easy and any surplus space left after the cover attachment is eliminated.

The hollow interior of the cover has an extent sufficient to insert the power transistor therein. The cover hollow interior has a width and a height that substantially correspond to a maximum width and a maximum height of the power transistor, respectively, and preferably greater than the maximum width and the maximum height by about 0.1 to 4 mm, more preferably by about 0.5 to 4 mm, most preferably by about 1 to 2 mm. The construction of the cover that its hollow interior has a width and a height that are slightly greater than a maximum width and a maximum height of the power transistor, respectively, has the advantage that when the power transistor enclosed within the cover is arranged in an electronic equipment, there can be left no surplus space around the transistor. The cover preferably has a length (between the front and rear ends) such that when the power transistor is mounted therein, at least ½, more preferably at least ⅘ of the terminals on the power transistor project out of the opening 21.

The cover of the invention is characterized in that the top and bottom walls 23 and 24 of the cover body 20 are formed to different thickness so that one wall is at least 0.1 mm thicker than the other wall. Often, one wall is thicker than the other wall by about 0.1 mm to 0.9 mm, preferably by about 0.1 mm to 0.5 mm, more preferably by about 0.15 mm to 0.3 mm. Typically the thicker wall (bottom wall 24 in FIG. 5) has a thickness of about 0.4 mm to 1.0 mm, preferably about 0.45 mm to 0.8 mm, and the thinner wall (top wall 23 in FIG. 5) has a thickness of about 0.15 mm to 0.5 mm, preferably about 0.2 to 0.35 mm.

If the wall is too thin, it has a low withstand voltage strength, leaving a possibility of short circuits when metal chassises or heat release metal fins are used as the external heat sink. Such a thin wall also tends to lose the self-support force, failing to maintain its shape. On the other hand, if the wall is too thick, its heat dissipating effect may become poor.

Figure 6:
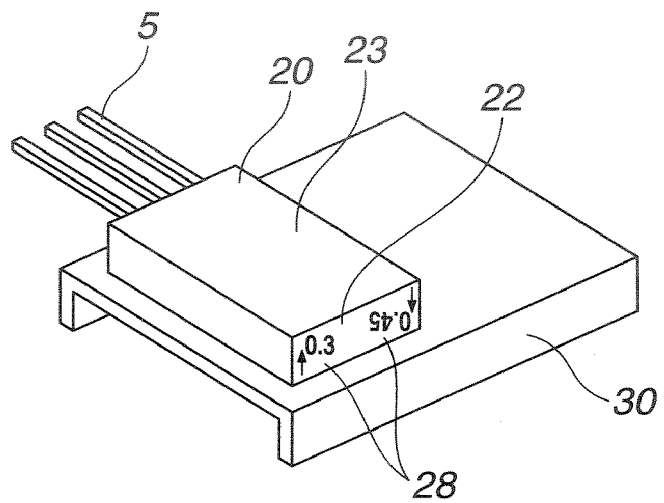
FIG. 6 is a perspective view of a heat-generating electronic part cover which is used in an application where electrical insulation is a matter of concern.

Another advantage of the cover of the invention is that a single cover (of the same type) serves for dual purposes. When the plate-shaped heat spreader of the power transistor is in contact with an external heat sink 30 via the thicker wall of the cover (bottom wall 24 in FIG. 5) as shown in FIG. 6, the cover provides better electrically insulating effects for the power supply or similar application where electrical insulation is a matter of concern requiring a certain insulation distance as prescribed by the electric safety standards. When the plate-shaped heat spreader of the power transistor is in contact with an external heat sink 30 via the thinner wall of the cover (top wall 23 in FIG. 5), the cover provides better heat dissipating effects for the application where heat dissipation is important rather than electrical insulation.

On the practical use of the cover, it is convenient if the thickness of two walls (top and bottom walls 23 and 24) is readily identifiable. To this end, as shown in FIG. 6, the closed rear wall 22 of the cover is printed, near the top and bottom walls, with markings 28 indicating the thickness of respective walls. Then the thickness of the wall is visible for easy identification. Advantageously, even after the electronic part is mounted within the cover, it is possible to see the cover wall thickness markings. The markings 28 may be colored or inscribed.

The cover may be formed of any material having heat conductive and electrically insulating properties. Inter alia, silicone rubber compositions loaded with inorganic fillers having heat conductive and electrically insulating properties are preferably used.

The silicone rubber composition comprises a base polymer and an inorganic filler. The base polymer preferably contains as a major component an organopolysiloxane having the average compositional formula: $R_aSiO_{(4-a)/2}$. In the formula, R is a substituted or unsubstituted monovalent hydrocarbon group of 1 to about 10 carbon atoms. Suitable hydrocarbon groups include alkyl groups such as methyl, ethyl, propyl, isopropyl, butyl, isobutyl, tert-butyl, 2-ethylbutyl, cyclopentyl, hexyl, cyclohexyl, and octyl; alkenyl groups such as vinyl, allyl and hexenyl; aryl groups such as phenyl, tolyl and xylyl; and aralkyl groups such as benzyl and phenylethyl. These groups may be further substituted with substituent groups such as halogen and cyano. The subscript "a" is a positive number in the range of 1.85 to 2.10.

Basically, the compound of the above formula is a diorganopolysiloxane of straight chain structure whose backbone consists of repeating diorganosiloxane units. As long as "a" is within the above range, trifunctional siloxane units may be incorporated. Also preferably, the molecular chain may be end-capped with triorganosiloxy groups such as vinyldimethylsiloxy, methyldivinylsiloxy or trivinylsiloxy, or hydroxydiorganosiloxy groups.

The organopolysiloxane preferably has at least two alkenyl groups in the molecule if the cure mode is addition vulcanization. In the case of peroxide vulcanization, the inclusion of alkenyl groups is not essential, but the inclusion of at least two alkenyl groups in the molecule is preferred. In the case of condensation vulcanization, the molecular chain is preferably end-capped with silanol groups or alkoxy-containing siloxane units.

The organopolysiloxane is preferably of the addition vulcanization (crosslinking) type or peroxide vulcanization (crosslinking) type. Inter alia, the organopolysiloxane is of the millable type, that is, a gum having a degree of polymerization (or the number of silicon atoms per molecule) of at least 3,000, especially at least 5,000.

The inorganic filler used herein should have both heat conductive and electrically insulating properties. Suitable inorganic fillers include powdered inorganic materials such as alumina, titanium dioxide, silicon dioxide, boron nitride and silicon nitride; and fibrous fillers such as glass fibers and asbestos. Inter alia, boron nitride, alumina and mixtures thereof are preferred fillers.

An appropriate amount of the inorganic filler loaded is in the range of 10 to 900 parts by weight, preferably 50 to 200 parts by weight per 100 parts by weight of the resin component (i.e., the above-described organopolysiloxane). Less than 10 pbw of the filler may fail to improve heat conductivity whereas more than 900 pbw may detract from strength.

On use of the silicone rubber composition described above, any well-known vulcanization means may be employed to form a cover of the organopolysiloxane in the cured state. Such well-known vulcanization means include peroxide vulcanization using organic peroxides as the curing agent, platinum addition vulcanization using a combination of an organohydrogenpolysiloxane and a platinum group metal catalyst as the curing agent, and moisture curing (or condensation curing) using a combination of a hydrolyzable silane and/or partial hydrolytic condensate thereof and an organometallic catalyst as the curing agent. Amounts of the curing agent and catalyst used may be in the range commonly employed for conventional silicone rubber compositions.

The silicone rubber composition in the cured state should preferably have a heat conductivity of at least 0.5 W/nm·° C.

The cover of the invention mounted to the power transistor may be used in the same manner as prior art tubular or cylindrical covers.

FIG. 6 illustrates an exemplary use of the cover in the application attributing importance to electrical insulation. In this embodiment, the cover is mounted to the power transistor such that the bottom surface of the heat spreader of the power transistor is in abutment with the inside surface of the thicker one of the top and bottom walls 23 and 24 of the cover body 20. The cover at the thicker wall side is fixedly secured to an external heat sink 30. Then the heat spreader of the power transistor is in contact with the external heat sink 30 via the thicker cover wall. The closed rear wall 22 of the cover at the outside is printed, near the top (thinner) and bottom (thicker) walls, with markings 28 ("0.3 mm" and "0.45 mm") indicating the thickness of respective walls.

The use of the cover illustrated in FIG. 6 is suited for the application attributing importance to electrical insulation. When it is desired to use the cover in the application attributing importance to heat dissipation, the mounting strategy selects the thinner wall of the cover 20 as the wall in contact with the heat spreader of the power transistor and the external heat sink, and the cover is mounted to the power transistor in accordance with this strategy.

Although the foregoing description refers to a power transistor as the heat-generating electronic part, the cover of the invention is equally applicable to heat-generating electronic parts other than power transistors.

Japanese Patent Application No. 2005-304324 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A cover for the electrical insulation and heat dissipation of a heat-generating electronic part having a top surface and a bottom surface at least one of which is flat, wherein
said cover comprises a hollow cover body of quadrangular prism shape having a top wall, a bottom wall, side walls, one open end and another closed end and defining a hollow interior into which the electronic part is to be inserted, said interior has a width and a height that substantially correspond to a maximum width and a maximum height of the electronic part, respectively, the top and bottom walls of said cover body have inside surfaces which are formed flat so as to correspond to the flat surface of the electronic part and slidably contact therewith, and the top and bottom walls of said cover body are formed to different thickness so that one wall is at least 0.1 mm thicker than the other wall.

2. The cover of claim 1 wherein of the top and bottom walls of said cover body, the one wall is 0.1 mm to 0.9 mm thicker than the other wall.

3. The cover of claim 1 wherein of the top and bottom walls of said cover body, the one wall has a thickness of 0.4 mm to 1.0 mm and the other wall has a thickness of 0.15 mm to 0.5 mm.

4. The cover of claim 1 wherein the hollow interior of said cover body is rectangular in cross section.

5. The cover of claim 1 wherein the outside surface of the other closed end of said cover body bears marking that indicates at least one of the thicknesses of the top and bottom walls.

6. The cover of claim 1 wherein said cover body is formed of a cured silicone rubber composition loaded with a heat conductive, electrically insulating inorganic filler.

7. The cover of claim 6 wherein the cured silicone rubber composition has a heat conductivity of at least 0.5 W/m·° C.

8. The cover of claim 1 wherein the electronic part to be inserted into the cover is rectangular in cross section.

* * * * *